United States Patent
Li et al.

(10) Patent No.: US 9,847,304 B2
(45) Date of Patent: Dec. 19, 2017

(54) ELECTRONIC DEVICE PACKAGES WITH CONFORMAL EMI SHIELDING AND RELATED METHODS

(71) Applicant: Intel Corporation, Santa Clara, CA (US)

(72) Inventors: Eric Li, Chandler, AZ (US); Joshua Heppner, Chandler, AZ (US); Rajendra Dias, Phoenix, AZ (US); Mitul Modi, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/998,292

(22) Filed: Dec. 24, 2015

(65) Prior Publication Data

US 2017/0186708 A1 Jun. 29, 2017

(51) Int. Cl.
*H01L 23/60* (2006.01)
*H01L 23/31* (2006.01)
*H01L 21/56* (2006.01)
*H01L 21/78* (2006.01)

(52) U.S. Cl.
CPC ............ *H01L 23/60* (2013.01); *H01L 21/561* (2013.01); *H01L 21/78* (2013.01); *H01L 23/3185* (2013.01)

(58) Field of Classification Search
CPC . H01L 2224/48227; H01L 2224/73265; H01L 2224/32225; H01L 2924/181; H01L 21/565; H01L 23/552; H01L 21/56; H01L 23/60; H01L 23/3185; H01L 21/561; H01L 21/78

USPC .......................................................... 257/659
See application file for complete search history.

(56) References Cited

U.S. PATENT DOCUMENTS

| 2005/0280139 A1* | 12/2005 | Zhao ..................... H01L 23/24 257/704 |
|---|---|---|
| 2011/0316156 A1 | 12/2011 | Pagaila et al. |
| 2015/0303075 A1 | 10/2015 | Han |

OTHER PUBLICATIONS

Search Report and Written Opinion for International Patent Application PCT/US2016/063731 filed Nov. 24, 2016; dated Feb. 27, 2017; 9 pages.

* cited by examiner

*Primary Examiner* — Caleen Sullivan
(74) *Attorney, Agent, or Firm* — Thorpe North and Western, LLP; David W. Osborne (57) ABSTRACT

Electronic device package technology is disclosed. In one example, an electronic device package can include a bottom surface and a side surface extending from the bottom surface. The side surface can be oriented at a non-perpendicular angle relative to the bottom surface. In another example, an electronic device package can include a top planar surface having a first area, a bottom planar surface having a second area, and a side surface extending between the top surface and the bottom surface. The second area can be larger than the first area. In yet another example, an electronic device package can include a substrate defining a plane, an electronic component disposed on the substrate, and a layer of material disposed about a lateral side of the electronic component. The layer of material can be oriented at an angle of less than 90 degrees relative to the plane.

9 Claims, 7 Drawing Sheets

ELECTRONIC DEVICE PACKAGES WITH CONFORMAL EMI SHIELDING AND RELATED METHODS

TECHNICAL FIELD

Embodiments described herein relate generally to electronic device packages.

BACKGROUND

Electromagnetic interference (EMI) shielding is routinely used on electronic device packages with small form factors. EMI shielding is important when electronic components are positioned close together in order to reduce or prevent disturbances in operation. One mechanism for creating EMI shielding is with a conformal sputtering technique. In this case, the material of the EMI shield is sputtered or deposited on an exposed outer surface of the electronic device package to a desired thickness in order to create an EMI shield layer.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this specification and the appended claims, the singular forms "a," "an" and "the" include plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. patent law. "Consisting essentially of" or "consists essentially of" have the meaning generally ascribed to them by U.S. patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the specification, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

EMI shielding layers are often created using a deposition technique, such as conformal sputtering. Such techniques typically have a slow deposition rate which can limit the overall throughput of the process. In addition, such processes are typically highly directional processes where the deposition rate onto the sides of an object can be significantly lower than the deposition rate onto the top of an object (e.g., the side deposition rate can be about 50% of the top deposition rate). As a result, an EMI shielding layer created by such a technique often has more material on a top surface than is needed for an effective EMI shield, thus wasting material and slowing throughput of the process.

Accordingly, electronic device packages are disclosed in which the difference in sputtering deposition between the top and sides of the package are reduced or minimized. In one example, an electronic device package can include a bottom surface and a side surface extending from the bottom surface. The side surface can be oriented at a non-perpendicular angle relative to the bottom surface. In another example, an electronic device package can include a top planar surface having a first area, a bottom planar surface having a second area, and a side surface extending between the top surface and the bottom surface. The second area can be larger than the first area. In yet another example, an electronic device package can include a substrate defining a plane, an electronic component disposed on the substrate, and a layer of material disposed about a lateral side of the electronic component. The layer of material can be oriented at an angle of less than 90 degrees relative to the plane.

Figure 1:
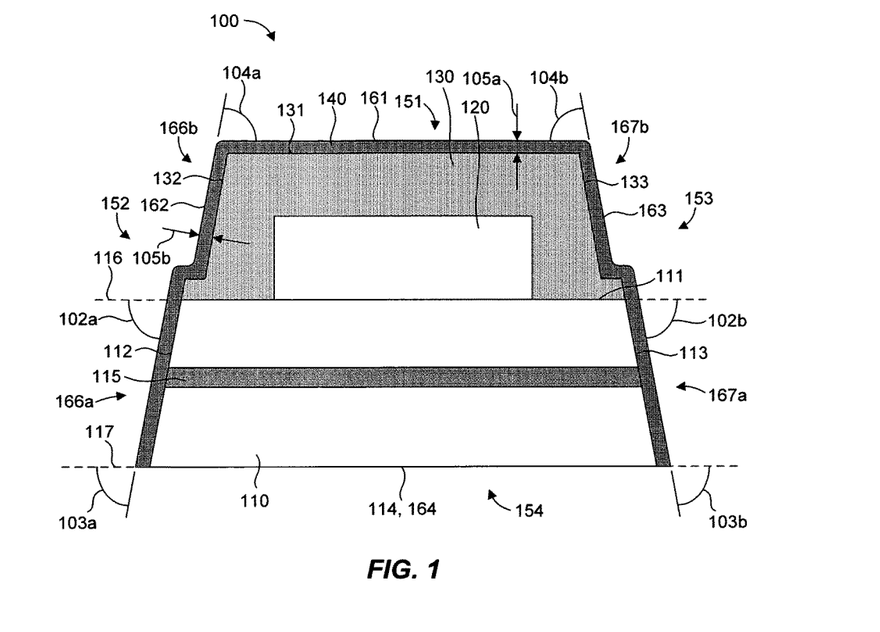
FIG. 1 illustrates an electronic device package in accordance with an example.

Referring to FIG. 1, an exemplary electronic device package 100 is illustrated. In general, the electronic device package 100 can include a substrate 110 and an electronic component 120 disposed on the substrate 110, such as on a top surface 111 of the substrate 110. The substrate 110 can include a grounding plane or trace 115 that can extend between lateral side surfaces 112, 113 of the substrate 110. The electronic component 120 can be any electronic device or component that may be included in an electronic device package, such as a semiconductor device (e.g., a die, a chip, or a processor).

The electronic component 120 can be encapsulated, such as with a mold compound or material 130 (e.g., an epoxy), to protect the electronic component 120 as well as electrical traces (not shown) or other electrical features or connections. The mold compound 130 can envelope the electronic component 120 and overlay the top surface 111 of the substrate 110. The mold compound 130 can have any suitable shape or configuration. For example, a top surface 131 and/or the side surfaces 132, 133 of the mold compound 130 can be planar surfaces, curved surfaces, etc.

From an exterior perspective, the electronic device package 100 can have a top surface 161, side surfaces 162, 163, and a bottom surface 164. The side surfaces 162, 163 can extend from the bottom surface 164, such as between the top surface 161 and the bottom surface 164. The electronic device package 100 can also include a layer 140 of material disposed about one or more sides of the package. In one aspect, one or more of the surfaces 161-164 of the electronic device package 100 can be formed by the layer 140 of material. For example, as illustrated in FIG. 1, the top surface 161 and the side surfaces 162, 163 can be formed by the layer 140 of material. Thus, as shown in the figure, portions of the layer 140 of material can be disposed about a top side 151 and/or one or more lateral sides 152, 153 of the electronic component 120. Furthermore, a portion of the layer 140 of material can be disposed about a portion of the substrate 110, such as about a lateral side of the substrate 110. In one aspect, the layer 140 of material can be a continuous layer or a discontinuous layer. In another aspect, the layer 140 of material can be the same material on the top surface 161 as on the side surface 162 and/or the side surface 163. Some portion of the substrate 110 can remain uncovered by the layer 140 of material, such as a bottom surface 114 of the substrate 110. In this case, the bottom surface 114 of the substrate 110 can form the bottom surface 164 of the electronic device package 100.

The layer 140 of material as a whole, or individual portions can be of any suitable shape or configuration. For example, the portion of the layer 140 of material disposed about the top side 151 of the electronic component 120 can be planar, as illustrated. Additionally, the portions of the layer 140 of material disposed about the lateral side 152 and/or the lateral side 153 can be planar. Typically, the layer 140 of material will have generally the same shape or configuration as the surfaces 131-133 of the underlying mold compound 130 and or the side surfaces 112, 113 of the substrate 110.

In one aspect, the layer 140 of material can form at least a portion of an EMI shield for the electronic component 120. For example, the layer 140 of material forming the top surface 161 and the side surfaces 162, 163 can form an EMI shield with the grounding plane or trace 115 included in the substrate 110. Thus, at least a portion of the layer 140 can be formed of an electrically conductive material. When the layer 140 of material is configured to form an EMI shield, the mold compound 130 can be a dielectric or electrically insulating material disposed between the electronic component 120 and the layer 140 of material. Any suitable dielectric or insulating material can be utilized in the mold compound 130. It should be recognized that the top surface 161, the side surface 162, and the side surface 163 can be formed at least in part by the layer 140 of material and configured individually or in any combination as an EMI shield.

In one aspect, the layer 140 of material can have a thickness 105a on the top surface 161 that is equal to, or substantially equal to, a thickness 105b on the at least one of the side surfaces 162, 163. In another aspect, the thickness 105b of the layer 140 of material on the side surface 162, 163 can be within about 80% of the thickness 105a of the layer 140 of material on the top surface 161. The thickness 105a and/or the thickness 105b of the layer 140 of material can be from about 0.5 µm to about 15 µm. In a particular aspect, thickness 105a and/or the thickness 105b can be from about 2 µm to about 5 µm. If the layer 140 of material is configured as an EMI shield, the thicknesses 105a, 105b can be increased if a less conductive material is used, such as for cost savings.

With further reference to FIG. 1, the substrate 110 can define a plane 116, such as with the top surface 111 of the substrate 110. The substrate 110 can also define a plane 117, such as with the bottom surface 114 of the substrate 110. In one aspect, at least a portion of the layer 140 of material can be oriented at an angle 102a, 102b of less than 90 degrees relative to the plane 116 and/or oriented at an angle 103a, 103b of less than 90 degrees relative to the plane 117. Thus, each side surface 162, 163 can be oriented at a non-perpendicular angle relative to the bottom surface 164. In another aspect, each side surface 162, 163 can be oriented at a non-perpendicular angle 104a, 104b, respectively, relative to the top surface 161.

In one aspect, the side surfaces 162, 163 can each have a first portion 166a, 167a extending from the bottom surface 164 and oriented at the angle 103a, 103b relative to the bottom surface 164. The first portions 166a, 167a can be disposed about the lateral sides of the substrate 110. In addition, the side surfaces 162, 163 can each have a second portion 166b, 167b extending from the top surface 161 and oriented at the angle 104a, 104b relative to the top surface 161. The second portions 166b, 167b can be disposed on and/or about the lateral sides of the mold compound 130. The angle 103a and the angle 104a can be equal or different from one another. Similarly, the angle 103b and the angle 104b can be equal or different from one another. Thus, the angles on the same side of the electronic device package 100 can be the same or different from one another. Furthermore, the angle 103a and the angle 103b can be equal or different from one another. In addition, the angle 104a and the angle 104b can be equal or different from one another. Thus, the angles on opposite sides of the electronic device package 100 can be the same or different from one another.

A component of the electronic device package 100 can include the top side 151 and the lateral side 152 and/or the lateral side 153 of the layer 140 of a conductive material, where one or both of the lateral side conductive layers is oriented at the non-perpendicular angle 104a, 104b relative to the top conductive layer.

Figure 2:
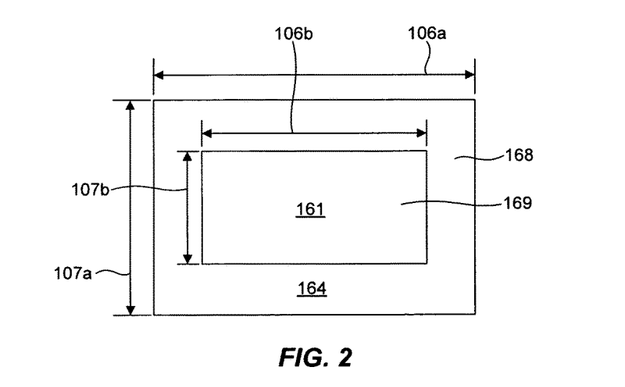
FIG. 2 illustrates a schematic representation of a top view of the electronic device package of FIG. 1.

In one aspect, schematically illustrated in the top view of FIG. 2, an area 168 of the bottom surface 164 can be larger than an area 169 of the top surface 161. The top and bottom surfaces 161, 164 can be planar in this example, although other configurations are possible. Length 106a and width 107a dimensions of the bottom surface 164 can be greater than corresponding length 106b and width 107b dimensions of the top surface 161.

Figure 3:
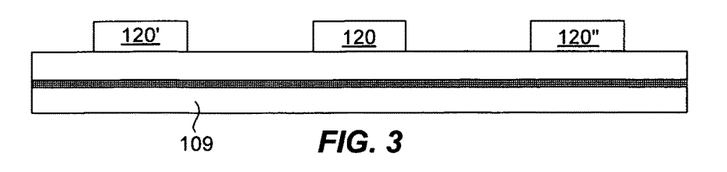
FIG. 3 illustrates a substrate with electronic components disposed thereon in accordance with an example of a method for making an electronic device package.
Figure 4:
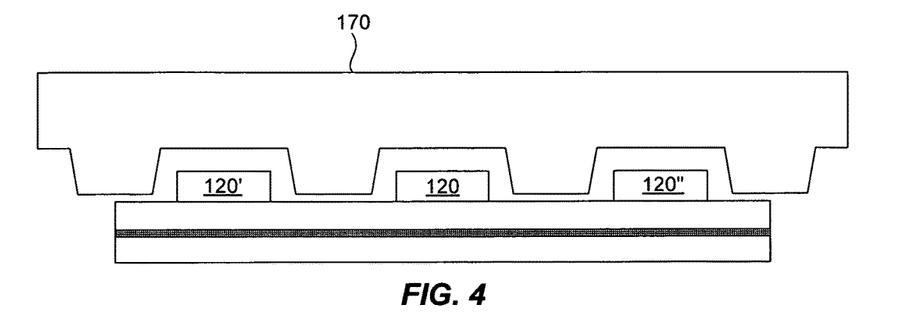
FIG. 4 illustrates positioning a mold chase to assist in encapsulating electronic components on a substrate in a mold compound in accordance with an example of a method for making an electronic device package.
Figure 5:
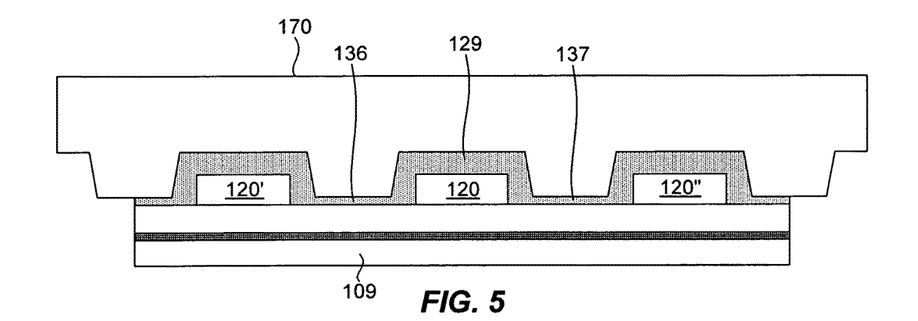
FIG. 5 illustrates encapsulating a mold compound over electronic components on a substrate by molding the mold compound about the electronic components in accordance with an example of a method for making an electronic device package.

FIGS. 3-9 illustrate an exemplary method or process for making an electronic device package, such as the electronic device package 100. FIG. 3 illustrates a substrate 109 with electronic components 120, 120', 120" disposed on the substrate 109. FIG. 4 illustrates a mold chase 170, which can be used to aid in encapsulating the electronic components 120, 120', 120", in a mold compound, and FIG. 5 illustrates encapsulating the electronic components 120, 120', 120" in a mold compound 129 by molding the mold compound 129 about the electronic components 120, 120', 120". Molding can include any suitable type of molding process, such as a transfer molding process and/or a compression molding process. FIG. 5 shows mold compound portion 136 between the electronic components 120, 120', and mold compound portion 137 between the electronic components 120', 120". It should be recognized that the mold chase 170 can be configured and positioned relative to the substrate 109 to minimize or prevent the formation of the mold compound portions 136, 137.

Figure 6:
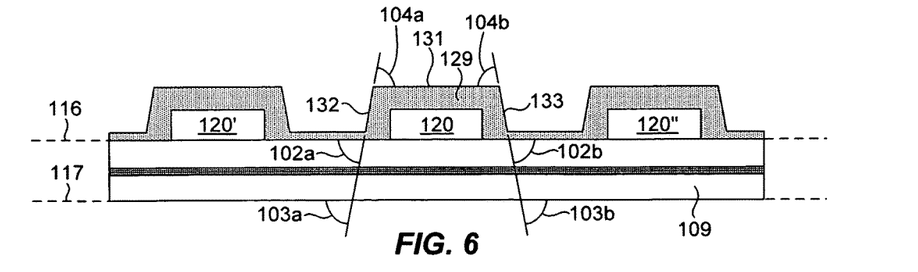
FIG. 6 illustrates a substrate with electronic components thereon and a layer of mold compound encapsulating the electronic components following removal of a mold chase in accordance with an example of a method for making an electronic device package.

As shown in FIG. 6, the side surface 132 about a lateral side of the electronic component 120 can be formed on the mold compound 129 such that the side surface 132 is oriented at the angle 102a relative to the plane 116 defined by the substrate 109 and/or the angle 103a relative to the plane 117 defined by the substrate 109. The side surface 133 about a lateral side of the electronic component 120 can also be formed on the mold compound 129 such that the side surface 133 is oriented at the angle 102b relative to the plane 116 and/or the angle 103b relative to the plane 117. In addition, the side surface 132 can be oriented at the angle 104a relative to the top surface 131 about a top side of the electronic component 120. Similarly, the side surface 133 can be oriented at the angle 104b relative to the top surface 131. The angles 102a-b, 103a-b, 104a-b are less than 90 degrees. Similar side surfaces can be formed in the mold compound 129 about the electronic components 120', 120".

Figure 7:
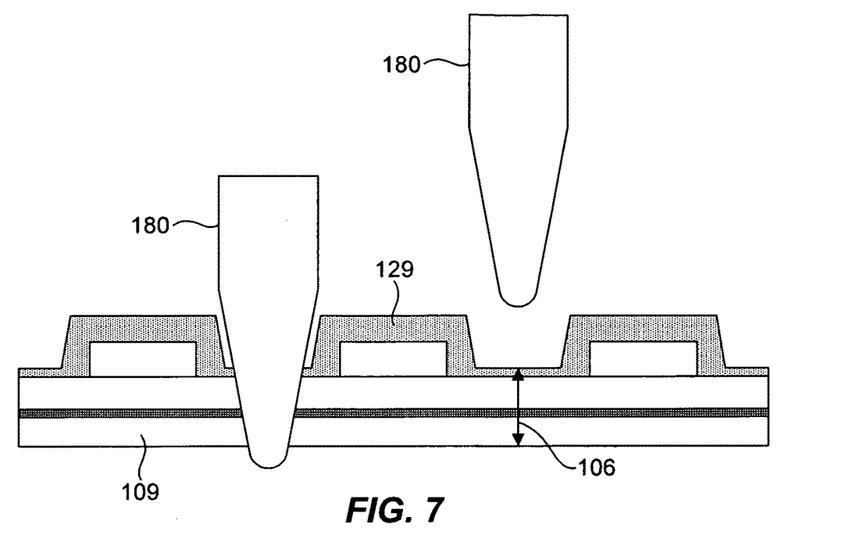
FIG. 7 illustrates dividing a substrate with a mold compound thereon between electronic components in order to separate the electronic components from one another into discrete packages in accordance with an example of a method for making an electronic device package.

FIG. 7 illustrates dividing the substrate 109 and the mold compound 129 between the electronic components 120, 120', 120" in order to separate the electronic components from one another into discrete packages. The substrate 109 can be subdivided into substrates of individual packages, such as the substrate 110 (see FIG. 8). Similarly, the mold compound 129 can be subdivided into mold compounds of individual packages, such as the mold compound 130 (see FIG. 8). FIG. 7 illustrates dividing the substrate 109 and the mold compound 129 by cutting, such as with a saw blade 180 (shown in two positions). Any suitable technique, including mechanical and chemical techniques, can be utilized to divide or separate the substrate 109 and/or the mold compound 129, such as cutting (e.g., laser), sawing, shearing, milling, broaching, etching, etc. Due to formation of the side surfaces 132, 133 of the mold compound 130 by the mold chase 170 and the minimized size or absence of the mold compound portions 136, 137, the thickness 106 of the material to be divided can be minimized, which can simplify and the process of forming individual packages.

Figure 8:
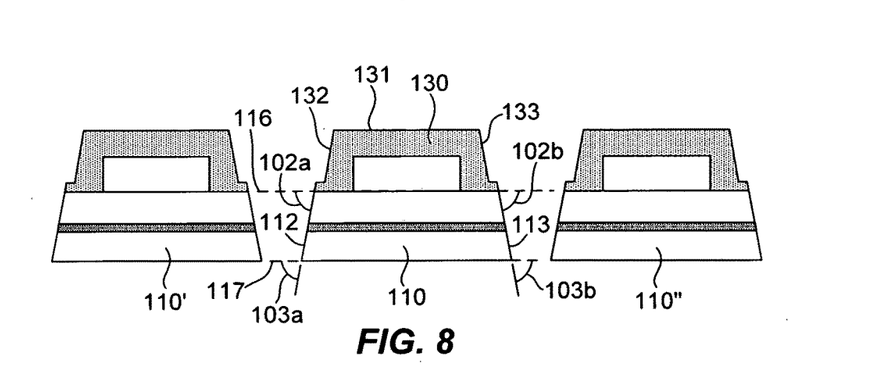
FIG. 8 illustrates electronic device packages following separation from a common substrate in accordance with an example of a method for making an electronic device package.

Dividing the substrate 109 can form the side surfaces 112, 113 of the substrate 110, as shown in FIG. 8. For example, the substrate 109 can be divided to form the side surface 112 of the substrate 110 oriented at the angle 102a relative to the plane 116 and/or the angle 103a relative to the plane 117. Similarly, the substrate 109 can be divided to form the side surface 113 of the substrate 110 oriented at the angle 102b relative to the plane 116 and/or the angle 103b relative to the plane 117. Similar side surfaces can be formed from the substrate 109 on subdivided substrates 110', 110". In this example, the angles of the side surfaces 112, 132 of the substrate 110 and the mold compound 130 relative to the plane 116 and/or the plane 117 are equal. In addition, the angles of the side surfaces 113, 133 of the substrate 110 and the mold compound 130 relative to the plane 116 and/or the plane 117 are equal. It should be recognized, however, that angles of substrate and mold compound side surfaces of can be different. The saw blade 180 can be beveled to provide the angled substrate side surfaces 112, 113.

A component of the electronic device package 100 can include the top molded surface 131 and the side molded surface 132 and/or the side molded surface 133, where one or both of the side molded surfaces is oriented at a non-perpendicular angle relative to the top molded surface.

Figure 9:
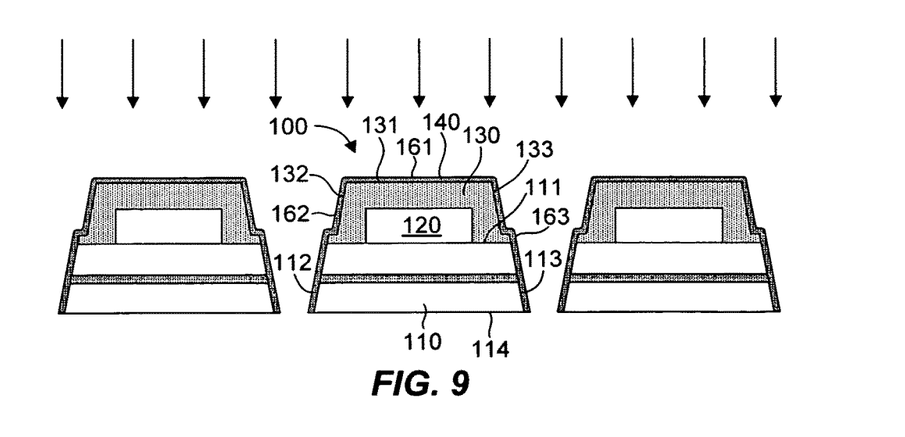
FIG. 9 illustrates electronic device packages with an EMI material layer formed thereon in accordance with an example of a method for making an electronic device package.

As shown in FIG. 9, the layer 140 of material can be formed on the surfaces 131-133 of the mold compound 130 to form the electronic device package 100. Portions of the layer 140 of material can be disposed about top and lateral sides of the electronic component 120. In addition, a portion of the layer 140 of material can be formed on a surface of the substrate 110, such as on the side surfaces 112, 113 of the substrate. The layer 140 can be formed by depositing material on the mold compound 130 and the substrate 110. Material can be deposited in any suitable manner, such as by a sputtering process.

Typically, as shown in FIG. 9, material will be deposited in a direction perpendicular to the top surface 131 of the mold compound 130, the top surface 111 of the substrate 110, and/or the bottom surface 114 of the substrate 110. It should be recognized that material can be deposited in any suitable direction relative to such features in order to deposit material in a direction that is non-parallel to the lateral side surfaces 132, 133 of the mold compound 130 and the side surfaces 112, 113 of the substrate 110. In one aspect, the orientation of the lateral side surfaces 132, 133 of the mold compound 130 and the side surfaces 112, 113 of the substrate 110 can be configured based on the material deposition direction such that the side surfaces are oriented non-parallel to the deposition direction. The orientation of the top surface 131 of the mold compound 130 can be perpendicular to the deposition direction.

By configuring the angles of the side surfaces 112, 113, 132, 133 relative to the mold compound top surface 131, the substrate top surface 111, and/or the substrate bottom surface 114 in a manner that maximizes the angle between the side surfaces and the sputtering direction, the sputtering deposition rate onto the side surfaces can be increased, thereby improving process throughput speed and material usage efficiency. Increased deposition rate onto the side surfaces can reduce the disparity in layer 140 thickness between the top and side surfaces. Thus, layer 140 thickness uniformity can be maximized by minimizing a perpendicular orientation of the side surfaces 162, 163 relative to the top surface 161 of the electronic device package 100.

The angles 102*a-b*, 103*a-b*, 104*a-b* can range from less than 90 degrees to greater than 0 degrees, limited only by practical considerations such as package size, which may be increased as these angles decrease thereby "widening" the package 100. In one aspect, a portion of the lateral side surface 162, 163 can extend over or above a portion of the electronic component 120, which can facilitate minimizing the angles 102*a-b*, 103*a-b*, 104*a-b* (e.g., minimizing the perpendicular orientation of the side surfaces 162, 163 relative to the top surface 161) while also minimizing the size of the package 100 for given angles 102*a-b*, 103*a-b*, 104*a-b*.

In one aspect, the layer 140 of material can form an electromagnetic shield as discussed above. A component of the electronic device package 100 can include the layer 140 of material deposited on the top and side molded surfaces 131-133. In one aspect, the layer 140 of material can provide electromagnetic interference shielding.

Figure 10:
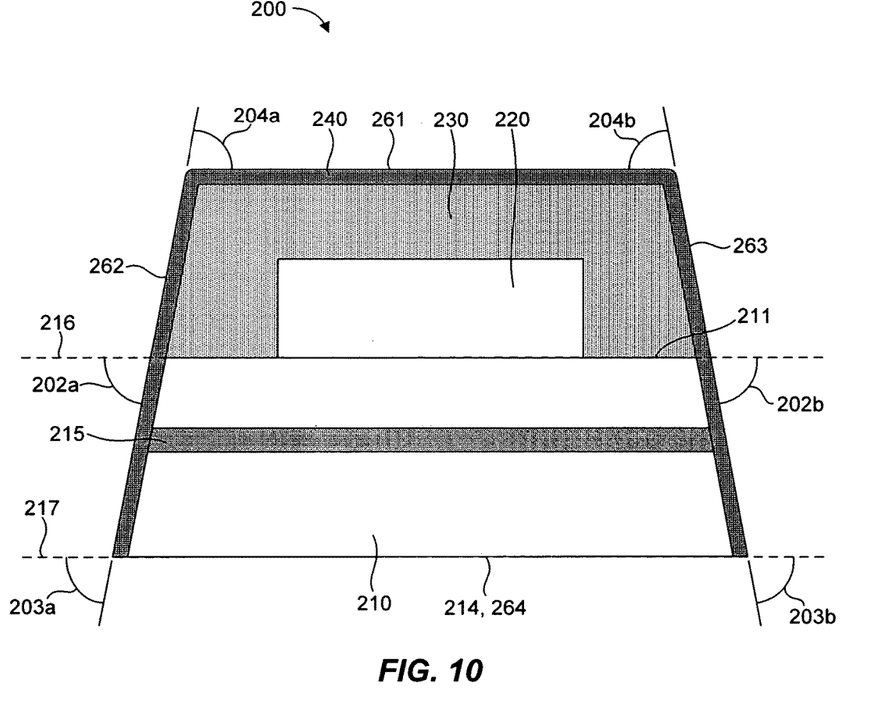
FIG. 10 illustrates an electronic device package with an EMI material layer formed thereon in accordance with another example.

FIG. 10 illustrates an electronic device package 200 in accordance with another example. The electronic device package 200 is similar in many respects to the electronic device package 100 discussed above. For example, the electronic device package 200 includes a substrate 210, an electronic component 220, a mold compound 230, and a layer 240 of material, as discussed above. Thus, the electronic component 220 can be disposed on a top surface 211 of the substrate 210, the mold compound 230 can encapsulate the electronic component 220, and the layer 240 of material can form an EMI shield about the electronic component 220, such with a grounding plane or trace 215 in the substrate 210.

The electronic device package 200 can have a top surface 261, side surfaces 262, 263, and a bottom surface 264. The side surfaces 262, 263 can extend from the bottom surface 264, such as between the top surface 261 and the bottom surface 264. The layer 240 of material can be disposed about one or more sides of the electronic device package 200. In one aspect, one or more of the surfaces 261-264 of the electronic device package 200 can be formed by the layer 240 of material. For example, as illustrated in FIG. 10, the top surface 261 and the side surfaces 262, 263 can be formed by the layer 240 of material. Thus, as shown in the figure, portions of the layer 240 of material can be disposed about a top side 251 and/or one or more lateral sides 252, 253 of the electronic component 220. Furthermore, a portion of the layer 240 of material can be disposed about a portion of the substrate 210, such as about a lateral side of the substrate 210. A bottom surface 214 of the substrate 210 can form the bottom surface 264 of the electronic device package 200.

In one aspect, the layer 240 of material can have a thickness 205*a* on the top surface 261 that is equal to a thickness 205*b* on the side surface 262, 263. In another aspect, the thickness 205*b* of the layer 240 of material on the side surface 262, 263 can be within about 80% of the thickness 205*a* of the layer 240 of material on the top surface 261. The thickness 205*a* and/or the thickness 205*b* of the layer 240 of material can be from about 0.5 μm to about 15 μm. In a particular aspect, thickness 205*a* and/or the thickness 205*b* can be from about 2 μm to about 5 μm.

The substrate 210 can define a plane 216, such as with the top surface 211 of the substrate 210. The substrate 210 can also define a plane 217, such as with the bottom surface 214 of the substrate 210. In one aspect, at least a portion of the layer 240 of material can be oriented at an angle 202*a*, 202*b* of less than 90 degrees relative to the plane 216 and/or oriented at an angle 203*a*, 203*b* of less than 90 degrees relative to the plane 217. Thus, each side surface 262, 263 can be oriented at a non-perpendicular angle relative to the bottom surface 264. In another aspect, each side surface 262, 263 can be oriented at a non-perpendicular angle 204*a*, 204*b*, respectively, relative to the top surface 261. The angle 202*a* and the angle 202*b* can be equal or different from one another. Similarly, the angle 203*a* and the angle 203*b* can be equal or different from one another. In addition, the angle 204*a* and the angle 204*b* can be equal or different from one another. Thus, the angles on opposite sides of the electronic device package 200 can be the same or different from one another.

Figure 11:
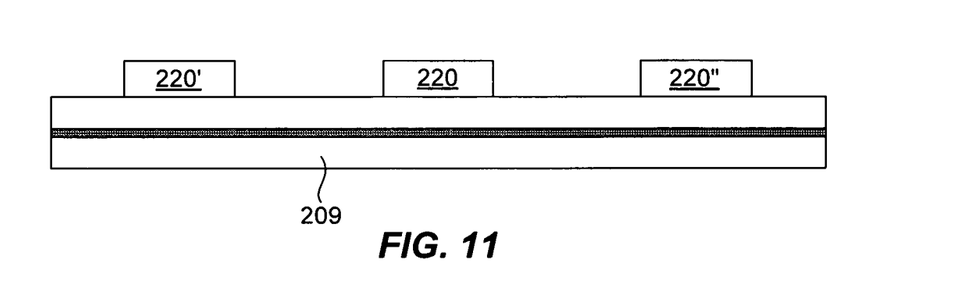
FIG. 11 illustrates a substrate with electronic components disposed thereon accordance with an example of a method for making an electronic device package.
Figure 12:
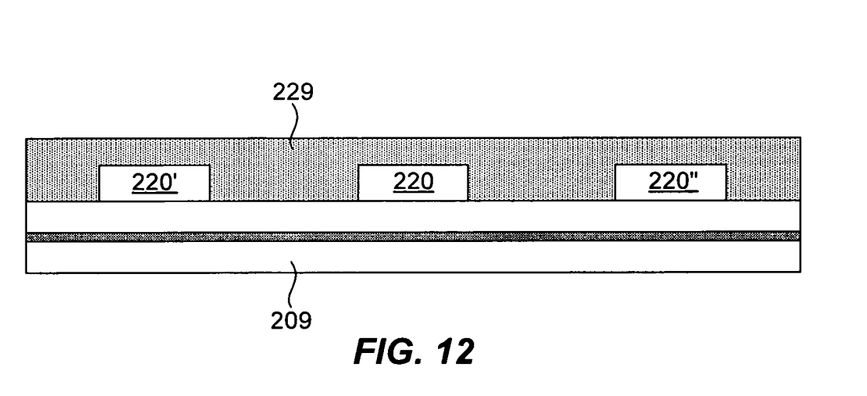
FIG. 12 illustrates a mold compound encapsulating electronic components on a substrate in accordance with an example of a method for making an electronic device package.

FIGS. 11-15 illustrate a method for making an electronic device package, such as the electronic device package 200. FIG. 11 illustrates a substrate 209 with electronic components 220, 220', 220" disposed on the substrate 209. FIG. 12 illustrates encapsulating the electronic components 220, 220', 220" in a mold compound 229 by molding the mold compound 229 about the electronic components 220, 220', 220". Molding can include any suitable type of molding process, such as a transfer molding process and/or a compression molding process.

Figure 13:
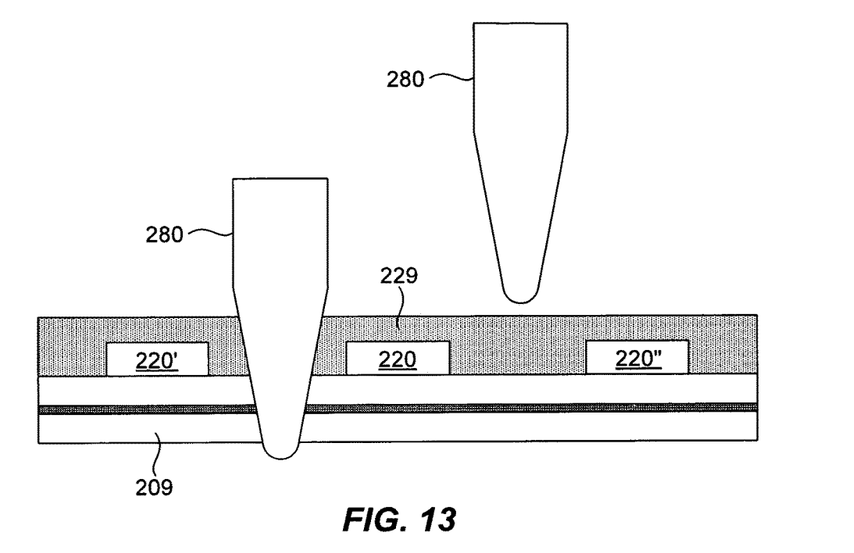
FIG. 13 illustrates dividing the substrate with a mold compound thereon between electronic components in order to separate the electronic components from one another into discrete packages in accordance with an example of a method for making an electronic device package.

FIG. 13 illustrates dividing the substrate 209 and the mold compound 229 between the electronic components 220, 220', 220" in order to separate the electronic components from one another into discrete packages. The substrate 209 can be subdivided into substrates of individual packages, such as the substrate 210 (see FIG. 14). Similarly, the mold compound 229 can be subdivided into mold compounds of individual packages, such as the mold compound 230 (see FIG. 14). FIG. 13 illustrates dividing the substrate 209 and the mold compound 229 by cutting, such as with a saw blade 280 (shown in two positions). Any suitable technique can be utilized to divide or separate the substrate 209 and/or the mold compound 229, such as cutting (e.g., laser), sawing, shearing, milling, broaching, etc.

Figure 14:
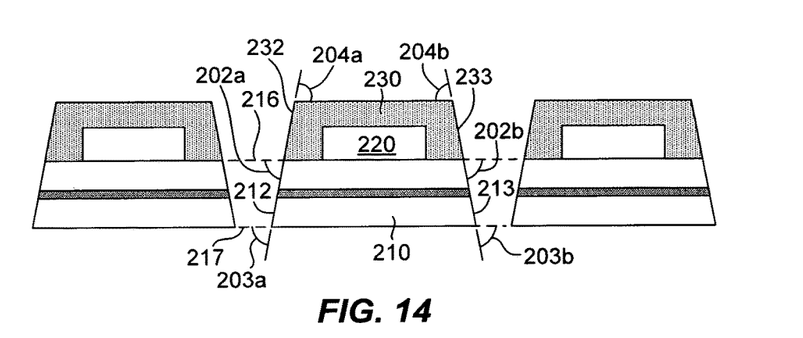
FIG. 14 illustrates electronic device packages after separation in accordance with an example of a method for making an electronic device package.

Dividing the substrate 209 can form the side surfaces 232, 223 of the mold compound 230 and the side surfaces 212, 213 of the substrate 210, as shown in FIG. 14. For example, the mold compound 229 can be divided to form the side surface 232 of the mold compound 230 oriented at the angle 202*a* relative to the plane 216 and/or the angle 203*a* relative to the plane 217. Similarly, the mold compound 229 can be divided to form the side surface 233 of the mold compound 230 oriented at the angle 202*b* relative to the plane 216 and/or the angle 203*b* relative to the plane 217. The side surface 232 of the mold compound 230 can be oriented at the angle 204*a* relative to the top surface 231 of the mold compound 230. Similarly, the side surface 233 of the mold compound 230 can be oriented at the angle 204*b* relative to the top surface 231 of the mold compound 230. Similar side surfaces can be formed from the mold compound 229 about the electronic components 220', 220". Thus, the side surfaces 232, 233 can be formed by removing a portion of the mold compound material 229. In addition, the substrate 209 can be divided to form the side surface 212 of the substrate 210 oriented at the angle 202*a* relative to the plane 216 and/or the angle 203*a* relative to the plane 217. Similarly, the substrate 209 can be divided to form the side surface 213 of the substrate 210 oriented at the angle 202*b* relative to the plane 216 and/or the angle 203*b* relative to the plane 217. The angles 202*a-b*, 203*a-b*, 204*a-b* are less than 90 degrees. Similar side surfaces can be formed from the substrate 209 on subdivided substrates 210', 210". The saw blade 280 can be beveled to provide the angled mold compound side surfaces 232, 233 and the angled substrate side surfaces 212, 213.

A component of the electronic device package 200 can include the top mold compound surface 231 and the side mold compound surface 232 and/or the side mold compound surface 233, where one or both of the side mold compound surfaces is oriented at a non-perpendicular angle relative to the top mold compound surface.

Figure 15:
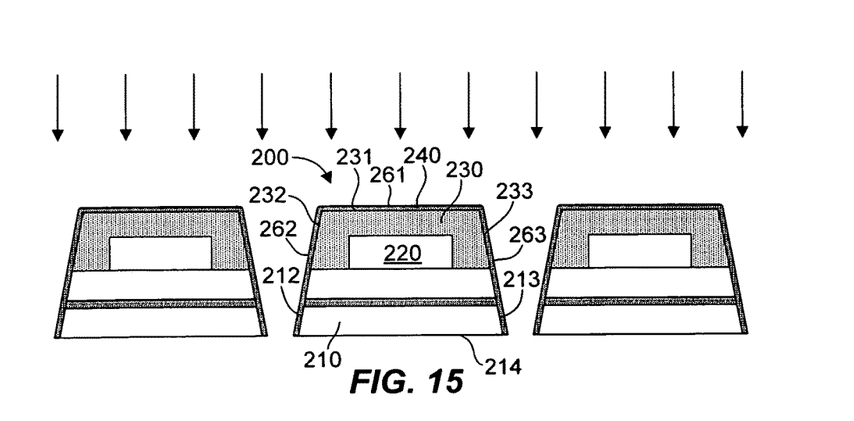
FIG. 15 illustrates electronic device packages with an EMI layer formed thereon in accordance with an example of a method for making an electronic device package.

As shown in FIG. 15, the layer 240 of material can be formed on the surfaces 231-233 of the mold compound 230 to form the electronic device package 200. Portions of the layer 240 of material can be disposed about top and lateral sides of the electronic component 220. In addition, a portion of the layer 240 of material can be formed on a surface of the substrate 210, such as on the side surfaces 212, 213 of the substrate. The layer 240 can be formed by depositing material on the mold compound 230 and the substrate 210. Material can be deposited in any suitable manner, such as by a sputtering process.

Material typically will be deposited in a direction perpendicular to the top surface 231 of the mold compound 230, the top surface 211 of the substrate 210, and/or the bottom surface 214 of the substrate 210, as shown in FIG. 15. It should be recognized that material can be deposited in any suitable direction relative to such features in order to deposit material in a direction that is non-parallel to the lateral side surfaces 232, 233 of the mold compound 230 and the lateral side surfaces 212, 213 of the substrate 210. In one aspect, the orientation of the lateral side surfaces 232, 233 of the mold compound 230 and the side surfaces 212, 213 of the substrate 210 can be configured based on the material deposition direction such that the side surfaces are oriented non-parallel to the deposition direction. The orientation of the top surface 231 of the mold compound 230 can be perpendicular to the deposition direction.

By configuring the angles of the side surfaces 212, 213, 232, 233 relative to the mold compound top surface 231, the substrate top surface 211, and/or the substrate bottom surface 214 in a manner that maximizes the angle between the side surfaces and the sputtering direction, the sputtering deposition rate onto the side surfaces can be increased, thereby improving process throughput speed and material usage efficiency. Increased deposition rate onto the side surfaces can reduce the disparity in layer 240 thickness between the top and side surfaces. Thus, layer 240 thickness uniformity can be maximized by minimizing a perpendicular orientation of the side surfaces 262, 263 relative to the top surface 261 of the electronic device package 200.

The angles 202*a-b*, 203*a-b*, 204*a-b* can range from less than 90 to degrees to greater than 0 degrees, limited only by practical considerations such as package size, which may be increased as these angles decrease thereby "widening" the package 200. In one aspect, a portion of the lateral side surface 262, 263 can extend over or above a portion of the electronic component 220, which can facilitate minimizing the angles 202*a-b*, 203*a-b*, 204*a-b* (e.g., minimizing the perpendicular orientation of the side surfaces 262, 263 relative to the top surface 261) while also minimizing the size of the package 200 for given angles 202*a-b*, 203*a-b*, 204*a-b*.

Figure 16:
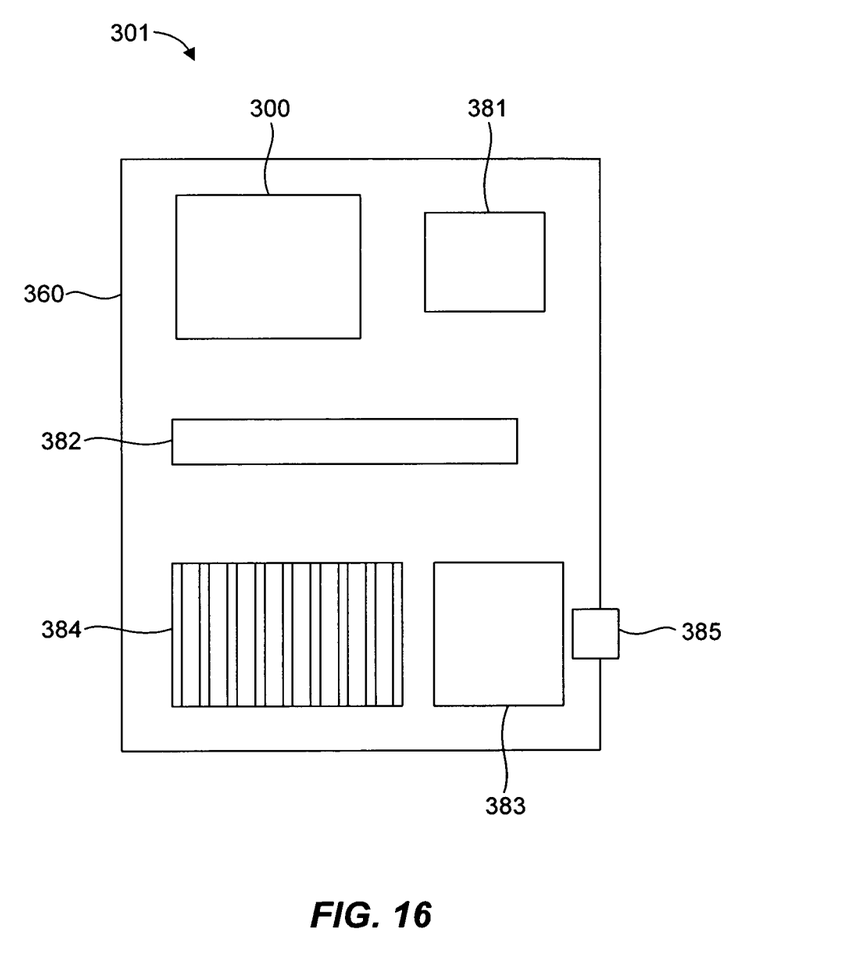
FIG. 16 is a schematic illustration of an exemplary computing system.

FIG. 16 illustrates an example computing system 301. The computing system 301 can include an electronic device package 300 as disclosed herein, coupled to a motherboard 360. In one aspect, the computing system 301 can also include a processor 381, a memory device 382, a radio 383, a heat sink 384, a port 385, a slot, or any other suitable device or component, which can be operably coupled to the motherboard 360. The computing system 301 can comprise any type of computing system, such as a desktop computer, a laptop computer, a tablet computer, a smartphone, a server, etc.

Examples

The following examples pertain to further embodiments.

In one example there is provided, an electronic device package comprising a bottom surface, and a side surface extending from the bottom surface, wherein the side surface is oriented at a non-perpendicular angle relative to the bottom surface.

In one example of an electronic device package, the side surface is formed by a layer of material.

In one example of an electronic device package, the layer of material forms an electromagnetic shield.

In one example of an electronic device package, the electronic device package further comprises a top surface, wherein the side surface is oriented at a non-perpendicular angle relative to the top surface.

In one example of an electronic device package, the top surface is formed by the layer of material.

In one example of an electronic device package, the layer of material is a continuous layer.

In one example of an electronic device package, the layer of material is a discontinuous layer.

In one example of an electronic device package, the layer of material is the same material on the top surface as on the side surface.

In one example of an electronic device package, a thickness of the layer of material on the side surface is within about 80% of a thickness of the layer of material on the top surface.

In one example of an electronic device package, the layer of material on the top surface and the side surface is equal in thickness.

In one example of an electronic device package, the layer of material has a thickness of from about 0.5 µm to about 15 µm.

In one example of an electronic device package, the layer of material of the top surface forms an electromagnetic shield.

In one example of an electronic device package, the side surface comprises a first portion extending from the bottom surface and oriented at a first angle relative to the bottom surface, and a second portion extending from the top surface and oriented at a second angle relative to the top surface.

In one example of an electronic device package, the first angle is equal to the second angle.

In one example of an electronic device package, the layer of material of the second portion is disposed on a mold compound.

In one example of an electronic device package, the first portion and the second portion of the side surface are located on a same side of the electronic device package.

In one example there is provided, an electronic device package comprising a top planar surface having a first area, a bottom planar surface having a second area, wherein the second area is larger than the first area, and a side surface extending between the top surface and the bottom surface.

In one example of an electronic device package, the side surface is formed by a layer of material.

In one example of an electronic device package, the layer of material forms an electromagnetic shield.

In one example of an electronic device package, the side surface is oriented at a non-perpendicular angle relative to the top planar surface.

In one example of an electronic device package, the top planar surface is formed by the layer of material.

In one example of an electronic device package, the layer of material is a continuous layer.

In one example of an electronic device package, the layer of material is a discontinuous layer.

In one example of an electronic device package, the layer of material is the same material on the top surface as on the side surface.

In one example of an electronic device package, a thickness of the layer of material on the side surface is within about 80% of a thickness of the layer of material on the top planar surface.

In one example of an electronic device package, the layer of material on the top planar surface and the side surface is equal in thickness.

In one example of an electronic device package, the layer of material has a thickness of from about 0.5 µm to about 15 µm.

In one example of an electronic device package, the layer of material of the top planar surface forms an electromagnetic shield.

In one example of an electronic device package, the side surface comprises a first portion extending from the bottom planar surface and oriented at the first angle relative to the bottom planar surface, and a second portion extending from the top planar surface and oriented at a second angle relative to the top planar surface.

In one example of an electronic device package, the first angle is equal to the second angle.

In one example of an electronic device package, the layer of material of the second portion is disposed on a mold compound.

In one example of an electronic device package, the first portion and the second portion of the side surface are located on a same side of the electronic device package.

In one example of an electronic device package, length and width dimensions of the bottom planar surface are greater than corresponding length and width dimensions of the top planar surface.

In one example of an electronic device package, the electronic device package comprises a substrate defining a plane, an electronic component disposed on the substrate, and a layer of material disposed about a lateral side of the electronic component, wherein the layer of material is oriented at an angle of less than 90 degrees relative to the plane.

In one example of an electronic device package, the layer of material has a thickness of from about 0.5 µm to about 15 µm.

In one example of an electronic device package, the layer of material forms an electromagnetic shield.

In one example of an electronic device package, the electronic component comprises a semiconductor device.

In one example of an electronic device package, the electronic device package comprises a mold compound disposed between the electronic component and the layer of material.

In one example of an electronic device package, a portion of the layer of material is disposed about a top side of the electronic component.

In one example of an electronic device package, a thickness of the layer of material on the lateral side is within about 80% of a thickness of the layer of material on the top side.

In one example of an electronic device package, the layer of material on the top side and the lateral side is equal in thickness.

In one example of an electronic device package, the portion of the layer of material disposed about the top side of the electronic component is planar.

In one example of an electronic device package, a portion of the layer of material is disposed about a portion of the substrate.

In one example of an electronic device package, the portion of the layer of material is disposed about a lateral side of the substrate.

In one example of an electronic device package, the portion of the layer of material disposed about the lateral side of the substrate is oriented at a second angle less than 90 degrees relative to the plane.

In one example of an electronic device package, the first angle is equal to the second angle.

In one example of an electronic device package, the substrate includes a ground plane.

In one example of an electronic device package, the mold material envelops the electronic component.

In one example of an electronic device package, the mold material overlays a top surface of the substrate.

In one example there is provided a computing system comprising a motherboard, and an electronic device package operably coupled to the motherboard, the electronic device package including a bottom surface, and a side surface extending from the bottom surface, wherein the side surface is oriented at a non-perpendicular angle relative to the bottom surface.

In one example of a computing system, the computing system comprises a desktop computer, a laptop, a tablet, a smartphone, a server, or a combination thereof.

In one example of a computing system, the computing system further comprises a processor, a memory device, a heat sink, a radio, a slot, a port, or a combination thereof operably coupled to the motherboard.

In one example there is provided, a component of an electronic device package comprising a top molded surface, and a side molded surface, wherein the side molded surface is oriented at a non-perpendicular angle relative to the top molded surface.

In one example of a component of an electronic device package, the component of the electronic device package further comprises a layer deposited on the top and side molded surfaces.

In one example of a computing system, the layer provides electromagnetic interference shielding.

In one example there is provided, a component of an electronic device package comprising a top conductive layer, and a side conductive layer, wherein the side conductive layer is oriented at a non-perpendicular angle relative to the top conductive layer.

In one example of a component of an electronic device package, a thickness of the side conductive layer is within about 80% of a thickness of the top conductive layer.

In one example of a component of an electronic device package, the top conductive layer and the side conductive layer are equal in thickness.

In one example of a component of an electronic device package, each of the top conductive layer and the side conductive layer has a thickness of from about 0.5 µm to about 15 µm.

In one example of a component of an electronic device package, the side conductive layer comprises a first portion extending from the top conductive layer and oriented at the first angle, and a second portion extending from a bottom surface and oriented at a second angle relative to the bottom surface.

In one example of a component of an electronic device package, the first angle is equal to the second angle.

In one example of a component of an electronic device package, the first portion is disposed on a mold compound.

In one example of a component of an electronic device package, the first portion and the second portion of the side conductive layer are located on a same side of the electronic device package.

In one example there is provided, a method for making an electronic device package comprising disposing an electronic component on a substrate, the substrate defining a plane, encapsulating the electronic component in a mold compound, forming a side surface on the mold compound about a lateral side of the electronic component, such that the side surface is oriented at an angle of less than 90 degrees relative to the plane, and forming a layer of material on the surface of the mold compound.

In one example of a method for making an electronic device package, encapsulating the electronic component comprises molding the mold compound about the electronic component.

In one example of a method for making an electronic device package, molding comprises transfer molding.

In one embodiment, molding comprises compression molding.

In one example of a method for making an electronic device package, the electronic component comprises a plurality of electronic components.

In one example of a method for making an electronic device package, the side surface is formed by molding the mold material.

In one example of a method for making an electronic device package, the side surface is formed by removing a portion of the mold material.

In one example of a method for making an electronic device package, the electronic component is a plurality of electronic components and further comprising dividing the substrate between the electronic components in order to separate the plurality of electronic components from one another into discrete packages.

In one example of a method for making an electronic device package, dividing the substrate between electronic components is accomplished by sawing with a beveled saw blade and wherein the dividing forms a side surface of the substrate at an angle of less than 90 degrees relative to the plane.

In one example of a method for making an electronic device package, the angle of the substrate is equal to the angle of the side surface of the mold material.

In one example of a method for making an electronic device package, the electronic component is a plurality of electronic components and further comprising dividing the substrate between the electronic components in order to separate the plurality of electronic components from one another into discrete packages.

In one example of a method for making an electronic device package, dividing the substrate between electronic components is accomplished by sawing with a beveled saw blade and wherein the dividing forms the side surface of the mold compound.

In one example of a method for making an electronic device package, a portion of the layer of material is formed on the surface of the substrate.

In one example of a method for making an electronic device package, a portion of the layer of material is disposed about a top side of the electronic component.

In one example of a method for making an electronic device package, forming the layer of material comprises sputtering.

In one example of a method for making an electronic device package, the layer of material forms an electromagnetic shield.

In one example there is provided, a method of maximizing thickness uniformity of a layer deposited on a top and side surface of an electronic device package comprises minimizing a perpendicular orientation of the side surface relative to a top surface of the electronic device package, and depositing material on the top surface and the side surface.

In one example of a method of maximizing thickness uniformity of a layer, depositing material comprises sputtering.

In one example of a method of maximizing thickness uniformity of a layer, material is deposited in a direction perpendicular to the top surface.

In one example of a method of maximizing thickness uniformity of a layer, a method of making a computing system comprises obtaining a motherboard, obtaining an electronic device package including a bottom surface, and a side surface extending from the bottom surface, wherein the side surface is oriented at a non-perpendicular angle relative to the bottom surface, and coupling the electronic device package to the motherboard.

In one example of a method of maximizing thickness uniformity of a layer, the computing system comprises a desktop computer, a laptop, a tablet, a smartphone, a server, or a combination thereof.

In one example of a method of maximizing thickness uniformity of a layer, the method further comprises coupling a processor, a memory device, a heat sink, a radio, a slot, a port, or a combination thereof to the motherboard.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic device package, comprising:
   a substrate defining a plane;
   an electronic component disposed on the substrate; and
   a layer of material disposed about a lateral side of the electronic component,
   wherein a first portion of the layer of material is oriented at a first angle of less than 90 degrees relative to the plane, and a second portion of the layer of material is disposed about a lateral side of the substrate and oriented at a second angle less than 90 degrees relative to the plane, and
   wherein the first and second portions of the layer of material are laterally offset relative to one another.

2. The electronic device package of claim 1, wherein the layer of material has a thickness of from about 0.5 µm to about 15 µm.

3. The electronic device package of claim 1, wherein the layer of material forms an electromagnetic interference shield.

4. The electronic device package of claim 1, wherein the electronic component comprises a semiconductor device.

5. The electronic device package of claim 1, further comprising a mold compound disposed between the electronic component and the layer of material.

6. The electronic device package of claim 1, wherein a portion of the layer of material is disposed about a top side of the electronic component.

7. The electronic device package of claim 6, wherein a thickness of the layer of material on the lateral side is within about 80% of a thickness of the layer of material on the top side.

8. The electronic device package of claim 6, wherein the layer of material on the top side and the lateral side are equal in thickness.

9. The electronic device package of claim 6, wherein the portion of the layer of material disposed about the top side of the electronic component is planar.

* * * * *